(12) United States Patent
Po et al.

(10) Patent No.: US 8,373,485 B2
(45) Date of Patent: Feb. 12, 2013

(54) VOLTAGE LEVEL SHIFTING APPARATUS

(75) Inventors: Chen-Hao Po, Taipei County (TW);
Yen-Tai Lin, Hsinchu (TW); Way-Chen Wu, Taipei (TW); Ching-Shan Chien, Hsinchu County (TW)

(73) Assignee: eMemory Technology Inc., Hsinchu (TW)

( * ) Notice: Subject to any disclaimer, the term of this patent is extended or adjusted under 35 U.S.C. 154(b) by 41 days.

(21) Appl. No.: 13/090,283

(22) Filed: Apr. 20, 2011

(65) Prior Publication Data
US 2012/0268188 A1    Oct. 25, 2012

(51) Int. Cl.
*H03L 5/00* (2006.01)
(52) U.S. Cl. .............................. 327/333; 326/62; 326/81
(58) Field of Classification Search .......... 327/306–333; 326/62–63, 80–81
See application file for complete search history.

(56) References Cited

U.S. PATENT DOCUMENTS

| | | | |
|---|---|---|---|
| 4,490,629 A | 12/1984 | Barlow et al. | |
| 5,559,464 A | 9/1996 | Orii et al. | |
| 5,821,800 A | 10/1998 | Le et al. | |
| 6,566,930 B1 * | 5/2003 | Sato | 327/333 |
| 6,580,291 B1 * | 6/2003 | Lutley | 326/81 |
| 6,836,148 B2 * | 12/2004 | Pullen et al. | 326/81 |
| 7,145,370 B2 | 12/2006 | Bernard et al. | |
| 7,580,311 B2 | 8/2009 | Pesavento | |
| 7,696,805 B2 * | 4/2010 | Thorp et al. | 327/333 |

* cited by examiner

*Primary Examiner* — Dinh T. Le
(74) *Attorney, Agent, or Firm* — Jianq Chyun IP Office

(57) ABSTRACT

A voltage level shifting apparatus is disclosed. The voltage level shifting apparatus has a cross-coupled transistor pair, a plurality of transistor pairs, a first diode string, a second diode string and an input transistor pair. One of the transistor pairs is coupled to the cross-coupled transistor pair, and the transistor pairs are controlled by a plurality of reference voltages. The first and the second diode strings are coupled between two of the transistor pairs. Each of the first and the second diode strings has at least one diode. The input transistor pair receives a first and a second input voltage, and the first and second input voltages are complementary signals. The cross-coupled transistor pair generates and outputs a first output voltage and a second output voltage by shifting the voltage level of the first and the second input voltage.

16 Claims, 3 Drawing Sheets

US 8,373,485 B2

VOLTAGE LEVEL SHIFTING APPARATUS

BACKGROUND OF THE INVENTION

1. Field of Invention

The present invention relates to a voltage level shifting apparatus. More particularly, the present invention relates to a voltage level shifting apparatus capable of operating in either a high-voltage mode or a low-voltage mode.

2. Description of Related Art

Please refer to FIG. 1, which is a circuit diagram of a conventional voltage level shifting apparatus 100. The voltage level shifting apparatus 100 has the transistors P1 and P2 which are cross-coupled to form a cross-coupled transistor pair. The gate of the transistor P1 is coupled to a node IN2, and the gate of the transistor P2 is coupled to a node IN1. The sources/drains of the transistors P1 and P2 receive an operational voltage VPP. Moreover, the voltage level shifting apparatus 100 further comprises a transistor pair composed of transistors P3 and P4, a transistor pair composed of transistors N1 and N2, and a transistor pair composed of transistors N3 and N4.

The gates of the transistors P3 and P4 receive a reference voltage IV. The transistor P3 is serially coupled between the sources/drains of the transistors P1 and N1, and the transistor P4 is serially coupled between the sources/drains of the transistors P2 and N2. The gates of the transistors N1 and N2 receive a logic operational voltage Vdd. The transistor N1 is coupled between the transistors N3 and P3, and the transistor N2 is coupled between the transistors N4 and P4. The transistor N3 is coupled between the transistor N1 and a ground voltage GND, and the transistor N4 is coupled between the transistor N2 and the ground voltage GND.

When the operational voltage VPP is greater than the logic operational voltage Vdd, the voltage level shifting apparatus 100 raises the voltage levels of the input voltages IN and INB to generate and output the output voltages VOUT and VOUTB. The original voltage levels of the input voltages IN and INB are not greater than the logic operational voltage Vdd, and the maximum voltage levels of the output voltages VOUT and VOUTB could be equal to the operational voltage VPP. Since the operational voltage VPP could be transmitted to the transistors N1 and N2 through the transistors P3 and P4, and the logic operational voltage Vdd applied to the gates of the transistors N1 and N2 is less than the operational voltage VPP applied to the gates of the transistors P1 and P2, the transistors N1 and N2 of the voltage level shifting apparatus 100 must be laterally diffused metal oxide semiconductor (LDMOS) transistors, which are capable of withstanding a high cross-voltage (i.e. a voltage greater than the logic operational voltage Vdd).

Moreover, the voltage level shifting apparatus 100 further comprises a transistor string composed of transistors N5 and N7 and a transistor string composed of transistors N6 and N8. The transistors N5 and N6 are LDMOS transistors, which should be capable of withstanding high cross-voltages. The two transistor strings (N5 and N7) and (N6 and N8) are used to support the voltage level shifting apparatus 100 to perform an operation of shifting the voltage levels of the input voltages IN and INB when the operational voltage VPP is a low voltage.

For embedded memory design based on the standard CMOS logic process, there is strict constraint imposing on the bias applied to the device terminals To be specific, if the logic operational voltage is defined to be Vdd, the bias difference should not exceed the logic operational voltage Vdd for any of the drain, source, gate, and bulk terminals. If the bias difference does exceed the criteria, the imposed bias will damage the device reliability and the circuit will be worn out with time. Therefore, for a level shifting apparatus manufactured by the standard COM logic process, if the operational voltage VPP exceeds the logic operational voltage Vdd, the terminal bias difference of each device of the level shifting apparatus should be carefully examined. In the field of embedded non-volatile memory design, the operational voltage VPP relates to the high voltage write power supply and may easily exceed as much as three times of the logic operational voltage Vdd. Accordingly, terminal bias difference across each device of the level shifting apparatus should be examined even more thoroughly to avoid the reliability issue.

In other words, the conventional voltage level shifting apparatus 100 fails to obey the terminal bias difference constraint mentioned above for logic device. For example, if the operational voltage VPP is set to be three times of the logic operational voltage Vdd (i.e. 3×Vdd) and the level shifting apparatus 100 operates in a state where the input voltage IN is equal to logic operational voltage Vdd and the input voltage INB is equal to a second logic operational voltage Vss (e.g. the ground voltage GND). As a result, the output voltage VOUTB is equal to the second logic operational voltage Vss, and the output voltage VOUT is equal to the operational voltage VPP. Then the aforementioned stress bias will be imposed on the transistors P3 and P4. On the one hand, even if the reference voltage IV is equal to two times of the logic operational voltage Vdd (i.e. 2×Vdd) to relieve the constraint of the source-gate bias difference for both the transistors P3 and P4, because the node IN2 (i.e. bulk bias for the transistor P4) is biased to (IV+|VTP|), where VTP is the threshold voltage of the transistor P4, the gate-drain bias difference of the transistor P4 is equal to (2×Vdd−Vss), which exceeds the maximum-allowed value of Vdd. And, the source-drain bias difference of the transistor P4 is equal to (2×Vdd+|VTP|−Vss), which still exceeds the maximum-allowed value of Vdd. On the other hand, a similar stress bias condition occurs when the level shifting apparatus 100 operates in another state where IN=Vss and INB=Vdd. Obviously, in this state, the transistor P3 will experience either (2×Vdd−Vss) or (2×Vdd+|VTP|−Vss) stress bias condition. In brief, to solve the issue to relieve terminal stress bias condition of the standard CMOS logic device having an embedded nonvolatile memory and operating in a high voltage (e.g. as high as 3 times of the logic operational voltage Vdd), a new level shifting apparatus is proposed in the present invention.

SUMMARY OF THE INVENTION

The present invention provides a voltage level shifting apparatus capable of operating in either a high-voltage mode or a low-voltage mode.

The present invention provides a voltage level shifting apparatus. The voltage level shifting apparatus has a cross-coupled transistor pair, a plurality of transistor pairs, a first diode string, a second diode string and an input transistor pair. The cross-coupled transistor pair is coupled to an operational voltage. One of the transistor pairs is coupled to the cross-coupled transistor pair, the gates of transistors of each of the transistor pairs are coupled to each other, and the transistor pairs are controlled by a plurality of reference voltages. The first diode string and the second diode string are coupled between two of the transistor pairs, and each of the first diode string and the second diode string has at least a diode. The input transistor pair is coupled between the ground voltage and the transistor pairs in serial. The gates of transistors of the input transistor pair receive a first input voltage and a second input voltage, and the first input voltage and a second input voltage are complementary signals. The cross-coupled transistor pair has a first output end and a second output end, and the cross-coupled transistor pair shifts the first input voltage and the second input voltage according to the operational voltage to generate and output a first output voltage and a second output voltage through the first output end and the second output end respectively.

In light of the foregoing descriptions, the present invention uses diodes to form the diode strings, which are serially coupled between the drains/sources of two transistor pairs. Due to the voltage drop of the diode strings, most of the transistors of the transistor pairs and the diode strings of the voltage level shifting apparatus would not suffering from an excessive cross-voltage. Therefore, it is not required too much high-voltage devices capable of withstanding high voltages to construct the transistor pairs or the diode strings in the voltage level shifting apparatus. Accordingly, the layout area of the voltage level shifting apparatus could be decreased effectively, which results in a lower cost of a product.

In order to make the aforementioned and other features and advantages of the invention more comprehensible, embodiments accompanying figures are described in detail below.

DESCRIPTION OF EMBODIMENTS

Figure 1:
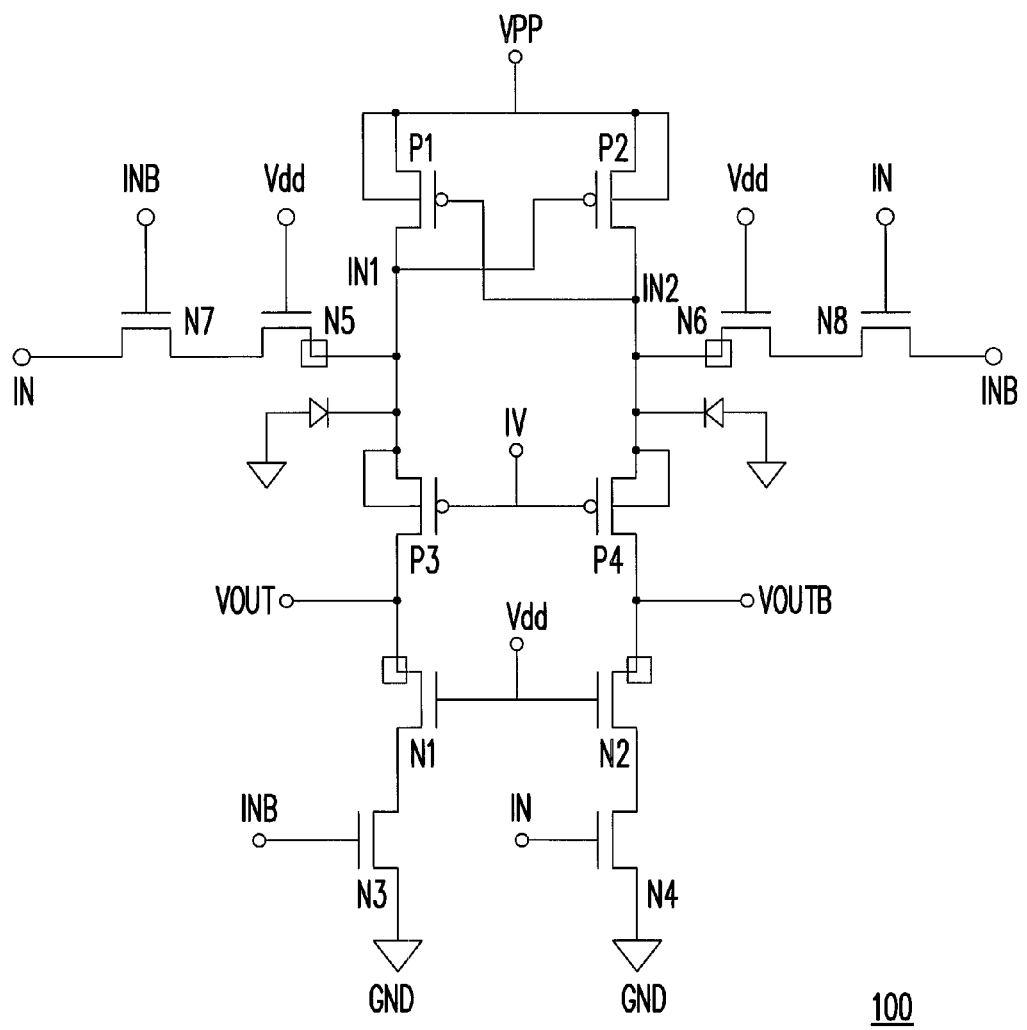
FIG. 1 is a circuit diagram of a conventional voltage level shifting apparatus 100.
Figure 2:
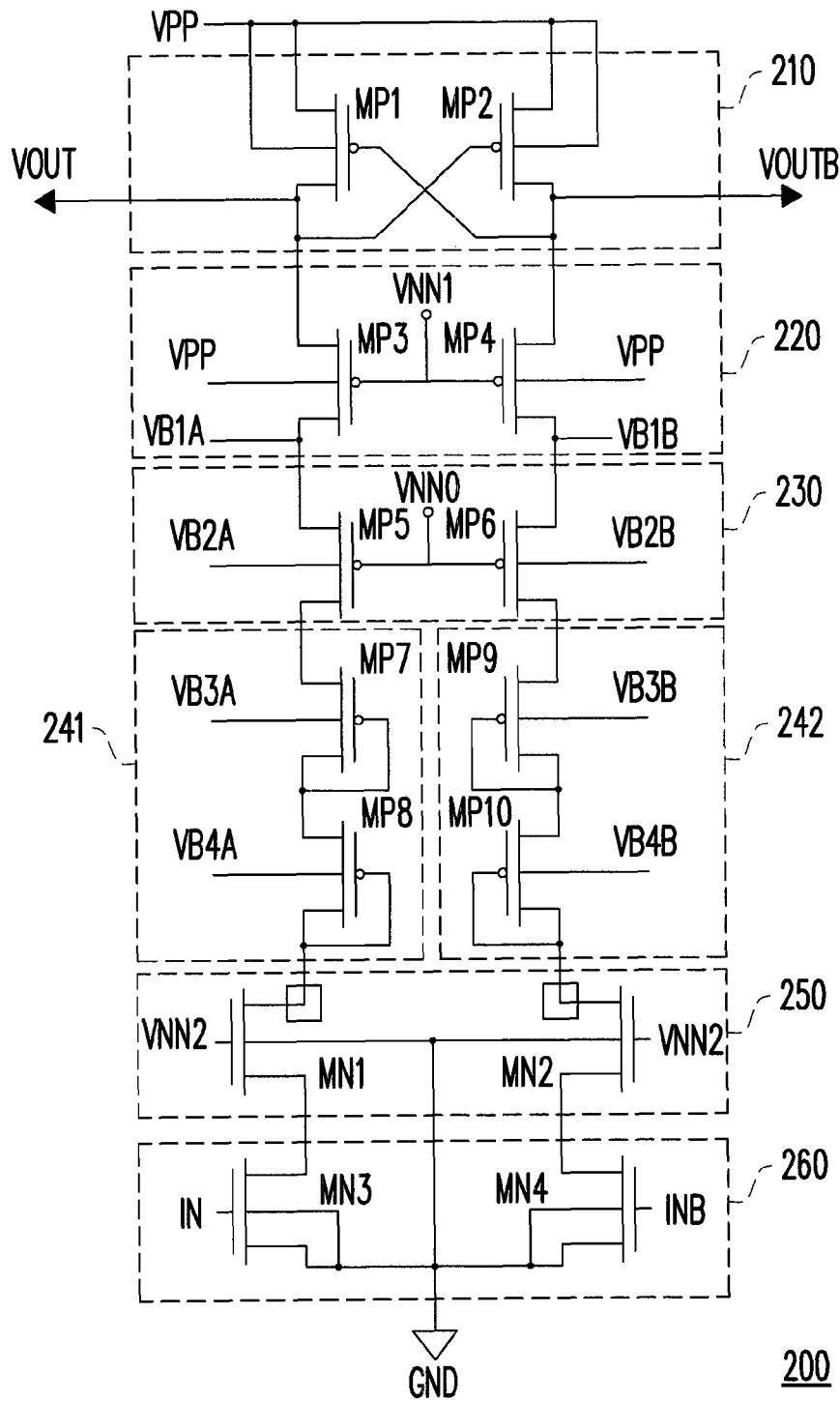
FIG. 2 is a circuit block diagram of a voltage level shifting apparatus 200 according to one embodiment of the invention.

Please refer to FIG. 2, which is a circuit block diagram of a voltage level shifting apparatus 200 according to one embodiment of the invention. The voltage level shifting apparatus 200 has a cross-coupled transistor pair 210, a plurality of transistor pairs 220, 230 and 250, two diode strings 241 and 242 and an input transistor pair 260. The cross-coupled transistor pair 210 is composed of two transistors MP1 and MP2. The gate of the transistor MP1 is coupled to the second source/drain of the transistor MP2. The gate of the transistor MP2 is coupled to the second source/drain of the transistor MP1, and the first sources/drains of the transistors MP1 and MP2 are coupled to an operational voltage VPP. Moreover, each of the second sources/drains of the transistors MP1 and MP2 of the cross-coupled transistor pair 210 has an output terminal for outputting output voltage VOUT or VOUTB, which are generated by the voltage level shifting apparatus 200. In the embodiment, the voltage level of the operational voltage VPP could be 3 to 5 times of the voltage level of the logic operational voltage Vdd.

The transistor pair 220 has two transistors MP3 and MP4 and is coupled to the cross-coupled transistor pair 210. The gates of the transistors MP3 and MP4 are coupled to a second reference voltage VNN1. The first source/drain of the transistor MP3 is coupled to the second source/drain of the transistor MP1, and the first source/drain of the transistor MP4 is coupled to the second source/drain of the transistor MP2. Additionally, it should be noted that the bases of the transistors MP3 and MP4 are coupled to the operational voltage VPP. The voltage levels of the bias voltages VB1A and VB1B are associated with the voltage values of the second reference voltage VNN1 and the output pair VOUT and VOUTB respectively. In principle, the bias voltage pair VB1A and VB1B and the second reference voltage VNN1 are selected properly, such that the cross-voltages of the transistors MP3 and MP4 are not greater than the maximum voltage that the logic devices could withstand. In other words, the transistors MP3 and MP4 could be constructed by low-voltage logic devices, and it is not necessary to use the high-voltage logic devices (e.g. LDMOS transistors) to form the transistors MP3 and MP4. In an embodiment of the present invention, the second reference voltage VNN1 is set to be equal to (HV−Vdd−VTP), where the voltage HV is a predetermined maximum level of the output voltages VOUT and VOUTB, the voltage Vdd is the logic operational voltage, and the voltage VTP is the threshold voltage of the transistors MP3 and MP4. Therefore, the output voltages VOUT and VOUTB of the voltage level shifting apparatus 200 are switched between HV and (HV−Vdd).

The transistor pair 230 has two transistors MP5 and MP6 and is coupled to the transistor pair 220. The gates of the transistors MP5 and MP6 are coupled to a first reference voltage VNN0. The first source/drain of the transistor MP5 is coupled to the second source/drain of the transistor MP3, and the first source/drain of the transistor MP6 is coupled to the second source/drain of the transistor MP4. The bases of the transistors MP5 and MP6 are coupled to a bias voltage pair VB2A and VB2B. Alike the transistor pair 220, the bias voltage VB2A could be selected according to the voltage value of the first reference voltage VNN0 and the source bias of the transistor MP5, and the bias voltage VB2B could be selected according to the voltage value of the first reference voltage VNN0 and the source bias of the transistor MP6. The key point is that the cross-voltages of the transistors MP5 and MP6 are not greater than the maximum voltage that the logic devices could withstand. Accordingly, the transistors MP5 and MP6 could be also constructed by low-voltage logic devices with small dimension.

The diode string 241 is serially coupled between the transistor MP5 of the transistor pair 230 and transistor pair 250. The diode string 241 is composed of two serial-connected transistors MP7 and MP8. Each of the transistors MP7 and MP8 is diode-connected to form one corresponding diode of the diode string 241. In the embodiment, the transistors MP7 and MP8 are P-type metal oxide semiconductor field effect transistors (PMOSFETs). The gates of the transistors MP7 and MP8 are coupled to the corresponding second sources/drains to form the cathodes of the diodes, and the first sources/drains of the transistors MP7 and MP8 are the anodes of the diodes. The diode string 242 is serially coupled between the transistor MP6 of the transistor pair 230 and transistor pair 250. The diode string 242 is composed of two serial-connected transistors MP9 and MP10. Alike the diode string 241, each of the transistors MP9 and MP10 is diode-connected to form one corresponding diode of the diode string 242.

In an embodiment, the first reference voltage VNN0 is set to be equal to the maximum voltage that the logic devices are allowed to withstand when the maximum level of the output voltages VOUT and VOUTB is set to HV. In other words, the first reference voltage VNN0 is equal to a maximum voltage, which is allowed to be applied to the transistors of the voltage level shifting apparatus 200. And, the voltage levels of the first sources/drains, coupled to the transistors MP3 and MP4, of the transistors MP5 and MP6 are switched between HV and (VNN0+VTP), where VTP is the threshold voltage of the transistors MP5 and MP6. Due to the existence of the first diode string 241 and the second diode string 242, the voltage levels of the second sources/drains, coupled to the diode strings 241 and 242, of the transistors MP5 and MP6 are raised to be greater than VTP. Accordingly, the minimum source bias of the transistors MP5 and MP6 would be equal to (VNN0+VTP), and the voltage gap between the source and drain of the transistor MP5 and the voltage gap between the source and drain of the transistor MP6 are less than the first reference voltage VNN0. Therefore, the cross-voltages of the transistors MP5 and MP6 are not greater than the maximum voltage that the logic devices are allowed to withstand.

The bases of the transistors MP7 and MP9 receive the bias voltage pair VB3A and VB3B, and the bases of the transistors MP8 and MP10 receive the bias voltage pair VB4A and VB4B. The bias voltage pairs VB3A and VB3B and VB4A and VB4B are set based on the cross-voltages of the transistors MP7-MP10. Accordingly, the transistors MP7-MP10 could be also constructed by low-voltage logic devices with small dimension.

It should be noted that two diodes are used to form one of the diode strings is merely an example of the present invention, and the designer of the circuit could determine the number of the diodes of each diode string according to the desired specification of the voltage level shifting apparatus 200 and the threshold voltages of the diodes.

The transistor pair 250 has the transistors MN1 and MN2. In an embodiment, the transistors MN1 and MN2 are laterally diffused metal oxide semiconductor (LDMOS) transistors. The first sources/drains of the transistors MN1 and MN2 are coupled to the second sources/drains of the transistors MP8 and MP10 of the diode strings 241 and 242. The bases of the transistors MN1 and MN2 are coupled to the ground voltage, and the gates of the transistors MN1 and MN2 receive a third reference voltage VNN2.

Due to the serial connections of the cross-coupled transistor pair 210, the transistor pairs 220 and 230 and the diode strings 241 of 242 between the operational voltage VPP and the transistor pair 250, the cross-voltages of the first sources/drains of the transistors MN1 and MN2 of the transistor pair 250 could be decreased effectively. Accordingly, in the embodiment, the third reference voltage VNN2 could be set to be equal to the logic operational voltage Vdd.

The transistor pair 260 is coupled between the transistor pair 250 and the ground voltage GND. The transistor pair 260 has the transistors MN3 and MN4. The first sources/drains of the transistors MN3 and MN4 are coupled to the second sources/drains of the transistors MN1 and MN2, the second sources/drains of the transistors MN3 and MN4 are coupled to the ground voltage GND, and the gates of the transistors MN3 and MN4 receive the input voltages IN and INB respectively. The input voltages IN and INB are complementary signals.

In light of the foregoing descriptions, all of the transistors MP1-MP10 and MN1-MN4 could be constructed by the logic devices under the general logic process. In other words, except the transistors MN1 and MN2, the voltage level shifting apparatus 200 does not need other high-voltage devices capable of withstanding high cross-voltages. Therefore, the layout area of the voltage level shifting apparatus 200 would not be too large, and the cost of the voltage level shifting apparatus 200 could be decreased.

Figure 3:
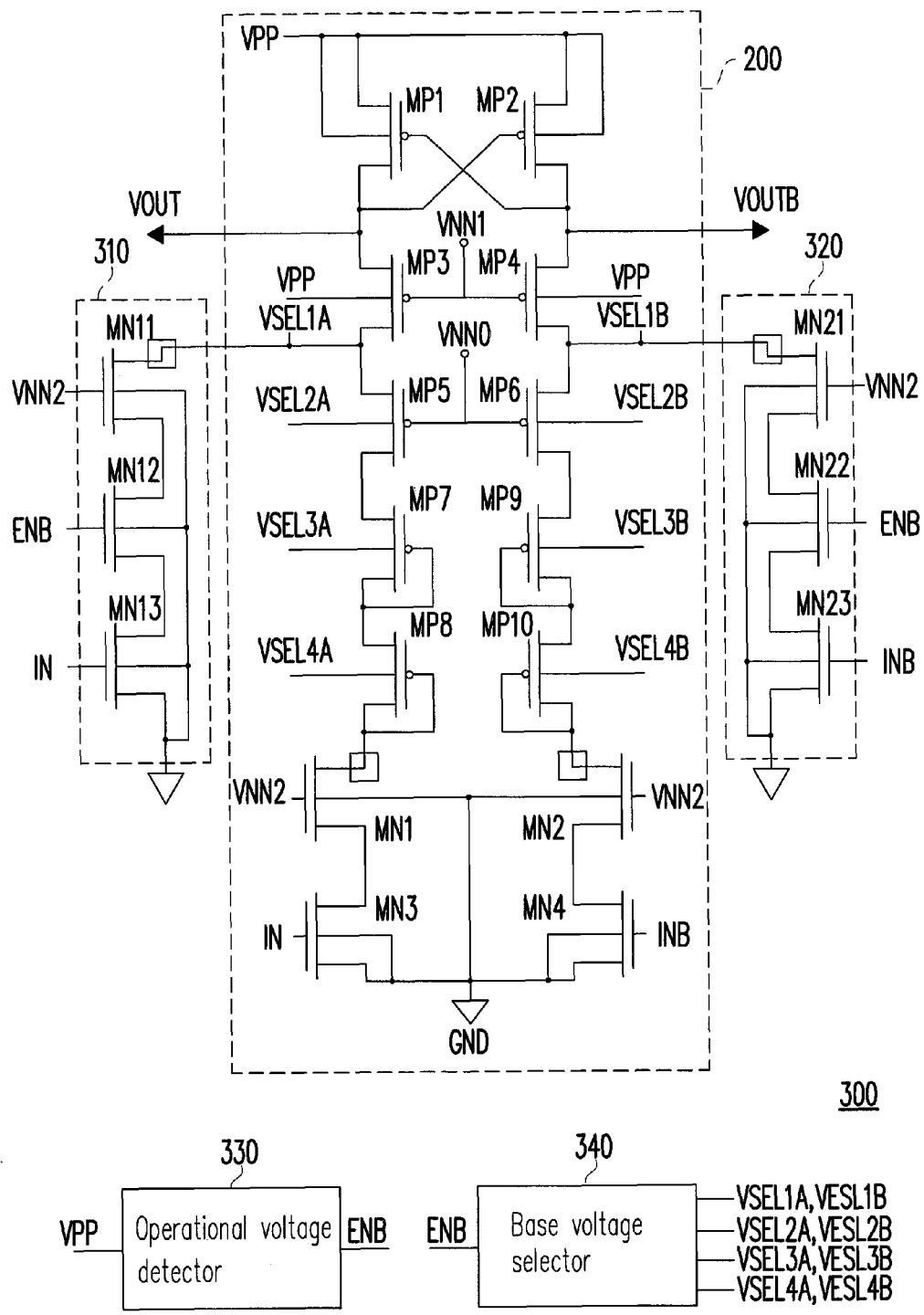
FIG. 3 is a circuit block diagram of a voltage level shifting apparatus 300 according to one embodiment of the invention.

Please refer to FIG. 3, which is a circuit block diagram of a voltage level shifting apparatus 300 according to one embodiment of the invention. In the voltage level shifting apparatus 300, besides the elements of the voltage level shifting apparatus 200, the voltage level shifting apparatus 300 further comprises two low-voltage-mode strings 310 and 320, an operational voltage detector 330, and a base voltage selector 340.

The low-voltage-mode string 310 is coupled to the second source/drain of the transistor MP3, and the low-voltage-mode string 310 has the transistors MN11, MN12, and MN13. In an embodiment, the transistor MN11 is an LDMOS transistor. The sources and drains of the transistors MN11, MN12 and MN13 are serially connected. The gate of the transistor MN11 is coupled to the third reference voltage VNN2, and the gate of the transistor MN12 is coupled to the mode selection signal ENB. The gate of the transistors MN13 is coupled to the input voltage IN, and the bases of the transistors MN11, MN12 and MN13 are coupled to the ground voltage GND.

The low-voltage-mode string 320 is coupled to the second source/drain of the transistor MP4, and the low-voltage-mode string 320 has the transistors MN21, MN22, and MN23. In an embodiment, the transistor MN21 is an LDMOS transistor. The sources and drains of the transistors MN21, MN22 and MN23 are serially connected. The gate of the transistor MN21 is coupled to the third reference voltage VNN2, and the gate of the transistor MN22 is coupled to the mode selection signal ENB. The gate of the transistors MN23 is coupled to the input voltage INB, and the bases of the transistors MN21, MN22 and MN23 are coupled to the ground voltage GND.

The operational voltage detector 330 receives the operational voltage VPP and generates the mode selection signal ENB according to the voltage level of the operational voltage VPP. Specifically, when the operational voltage VPP received by the operational voltage detector 330 is greater than the voltage level of the logic operational voltage Vdd, then the mode selection signal ENB is, for example, the logic level of "0" for notifying the voltage level shifting apparatus 300 to enter the high-voltage mode. On the contrary, when the operational voltage VPP received by the operational voltage detector 330 is not greater than the voltage level of the logic operational voltage Vdd, then the mode selection signal ENB is, for example, the logic level of "1" for notifying the voltage level shifting apparatus 300 to enter the low-voltage mode. In an embodiment, when the voltage level shifting apparatus 300 operates in the high-voltage mode, the operational voltage VPP is equal to the voltage HV, which is the predetermined maximum level of the output voltages VOUT and VOUTB. When the voltage level shifting apparatus 300 operates in the low-voltage mode, the operational voltage VPP is equal to the logic operational voltage Vdd.

When the mode selection signal ENB is logic level of "0", the transistors MN12 and MN22 are turned off simultaneously, such that the low-voltage-mode strings 310 and 320 are inactive. On the contrary, when the mode selection signal ENB is logic level of "1", the transistors MN12 and MN22 are turned on simultaneously, such that the low-voltage-mode strings 310 and 320 are active and the voltage levels of the input voltages IN and INB are shifted to output the output voltages VOUT and VOUTB.

The base voltage selector 340 is coupled to the operational voltage detector 330 and the voltage level shifting apparatus 200. The base voltage selector 340 receives the mode selection signal ENB generated by the operational voltage detector 330 and selects the third reference voltage VNN2 or other higher bias voltages as the voltage pairs (VSEL1A, VSEL1B), (VSEL2A, VSEL2B), (VSEL3A, VSEL3B), and (VSEL4A, VSEL4B). The third reference voltage VNN2 is equal to the logic operational voltage Vdd. Afterward, the base voltage selector 340 transmits the selected voltage pairs VSEL1A to VSEL4A and VSEL1B to VSEL4B to the bases of the transistors MP3-MP10. Specifically, when the mode selection signal ENB indicates that the voltage level shifting apparatus 300 operates in the high-voltage mode, the base voltage selector 340 selects the bias voltage pairs (VB1A, VB1B), (VB2A, VB2B), (VB3A, VB3B), and (VB4A, VB4B), as shown in FIG. 2, as the selected voltage pairs (VSEL1A, VSEL1B), (VSEL2A, VSEL2B), (VSEL3A, VSEL3B), and (VSEL4A, VSEL4B). Then, the selected voltage pair VSEL1A and VSEL1B is transmitted to the bases of the transistors MP3 and MP4, the selected voltage pair VSEL2A and VSEL2B is transmitted to the bases of the transistors MP5 and MP6, the selected voltage pair VSEL3A and VSEL3B is transmitted to the bases of the transistors MP7 and MP8, and the selected voltage pair VSEL4A and VSEL4B is transmitted to the bases of the transistors MP9 and MP10.

When the mode selection signal ENB indicates that the voltage level shifting apparatus 300 operates in the high-voltage mode, the selected voltage pairs (VB1A, VB1B), (VB2A, VB2B), (VB3A, VB3B), and (VB4A, VB4B) are the bigger value between the first reference voltage VNN0 and the source bias of the device it is connected to. On the contrary, when the mode selection signal ENB indicates that the voltage level shifting apparatus 300 operates in the low-voltage mode, the base voltage selector 340 selects the logic operational voltage Vdd as the selected voltage pairs (VB1A, VB1B), (VB2A, VB2B), (VB3A, VB3B), and (VB4A, VB4B) and transmits the logic operational voltage Vdd to the bases of the transistors MP3 and MP10.

In light of the above, the voltage level shifting apparatus 300 can operate in either the high-voltage mode or the low-voltage mode based on the operational voltage VPP of different voltage levels while the operational voltage detector 330 detects the mode selection signal ENB to control the base voltage detector 340 to provide the selected voltage pairs (VB1A, VB1B), (VB2A, VB2B), (VB3A, VB3B), and (VB4A, VB4B) as the base voltages of the transistors MP3-MP10. Therefore, the voltage level shifting apparatus 300 can operate in either the high-voltage mode or the low-voltage mode with the same circuit structure.

Additionally, except the transistors MN1, MN2, MN11 and MN21, the voltage level shifting apparatus 300 does not need other high-voltage devices capable of withstanding high cross-voltages, such that the layout area of the voltage level shifting apparatus 300 could be decreased.

For a 5.0V device, the logic operational voltage Vdd is set to 5.0 volts, the voltage HV is set to 20 volts, the second reference voltage VNN1 is set to 14 volts, and the first reference voltage VNN0 is set to 15 volts, such that any cross-voltage of the transistors MP1-MP10, MN3, MN4, MN12, MN13, MN22 and MN23 are not greater than 5.0 volts. For a 3.3V device, the logic operational voltage Vdd is set to 3.3 volts, the voltage HV is set to 10 volts, the second reference voltage VNN1 is set to 6 volts, and the first reference voltage VNN0 is set to 7 volts, such that any cross-voltage of the transistors MP1-MP10, MN3, MN4, MN12, MN13, MN22 and MN23 are not greater than 3.3 volts. For a 2.5V device, the logic operational voltage Vdd is set to 2.5 volts, the voltage HV is set to 7 volts, the second reference voltage VNN1 is set to 4 volts, and the first reference voltage VNN0 is set to 4.5 volts, such that any cross-voltage of the transistors MP1-MP10, MN3, MN4, MN12, MN13, MN22 and MN23 are not greater than 2.5 volts.

In summary, the present invention effectively reduces the cross-voltages of each transistor of the voltage level shifting apparatus by using a plurality of transistor pairs and two diode strings coupled between the sources/drains of two adjacent transistor pairs. Moreover, the bases of the transistors of the voltage level shifting apparatus are applied with proper selected base voltages, such that all of the transistors of the voltage level shifting apparatus could be constructed by the transistors of logic devices. Therefore, the layout area of the voltage level shifting apparatus could be decreased, and the cost thereof could be reduced. Additionally, the voltage level shifting apparatus can operate in either the high-voltage mode or the low-voltage mode based on the operational voltage detected by the operational voltage detector. Therefore, the voltage level shifting apparatus can operate in either the high-voltage mode or the low-voltage mode with the same circuit structure.

It will be apparent to those skilled in the art that various modifications and variations can be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:

1. A voltage level shifting apparatus, comprising:
    a cross-coupled transistor pair, coupled to an operational voltage;
    a plurality of transistor pairs, one of which being coupled to the cross-coupled transistor pair, the gates of transistors of each of the transistor pairs being coupled to each other, and the transistor pairs being controlled by a plurality of reference voltages;
    a first diode string;
    a second diode string, the first diode string and the second diode string coupled between two of the transistor pairs, and each of the first diode string and the second diode string having at least a diode;
    an input transistor pair, coupled between a ground voltage and the transistor pairs in serial, gates of transistors of the input transistor pair receiving a first input voltage and a second input voltage, and the first input voltage and a second input voltage being complementary signals;
    a first low-voltage-mode transistor string, having a plurality of first low-voltage-mode transistors coupled between the cross-coupled transistor pair and the ground voltage, the first low-voltage-mode transistors are respectively controlled by a third reference voltage of the reference voltages, a mode selection signal and the first input voltage;
    a second low-voltage-mode transistor string, having a plurality of second low-voltage-mode transistors coupled between the cross-coupled transistor pair and the ground voltage, the second low-voltage-mode transistors are respectively controlled by the third reference voltage, the mode selection signal and the second input voltage; and
    an operational voltage detector, coupled to the operational voltage, for generating the mode selection signal according to a voltage level of the operational voltage;
    wherein the cross-coupled transistor pair has a first output end and a second output end, and the cross-coupled transistor pair shifts the first input voltage and the second input voltage according to the operational voltage to generate and output a first output voltage and a second output voltage through the first output end and the second output end respectively.

2. The voltage level shifting apparatus as claimed in claim 1, further comprising:
    a base voltage selector, coupled to the operational voltage detector and the plurality of transistor pairs, the base voltage selector selecting and outputting one of the reference voltages or a logic operation voltage to bases of the transistors of the plurality of transistor pairs.

3. The voltage level shifting apparatus as claimed in claim 2, wherein the diodes of the first diode string and the second diode string are constructed by transistors, and the base voltage selector selects and outputs one of the reference voltages or the operational voltage further according to the mode selection signal to bases of the transistors of the first diode string and the second diode string.

4. The voltage level shifting apparatus as claimed in claim 1, wherein the third reference voltage is equal to a logic operational voltage of the voltage level shifting apparatus.

5. The voltage level shifting apparatus as claimed in claim 1, wherein the first low-voltage-mode transistors further comprise:
 a first transistor, comprising a gate, a first source/drain, and a second source/drain, wherein the gate of the first transistor receives the third reference voltage, and the first source/drain of the first transistor is coupled to the cross-coupled transistor pair;
 a second transistor, comprising a gate, a first source/drain, and a second source/drain, wherein the gate of the second transistor receives the mode selection signal, and the first source/drain of the second transistor is coupled to the second source/drain of the first transistor; and
 a third transistor, comprising a gate, a first source/drain, and a second source/drain, wherein the gate of the third transistor receives the first input voltage, the first source/drain of the third transistor is coupled to the second source/drain of the second transistor, and the second source/drain of the third transistor is coupled to the ground voltage.

6. The voltage level shifting apparatus as claimed in claim 5, wherein the first transistor is a laterally diffused metal oxide semiconductor (LDMOS) transistor.

7. The voltage level shifting apparatus as claimed in claim 1, wherein the second low-voltage-mode transistors further comprise:
 a fourth transistor, comprising a gate, a first source/drain, and a second source/drain, wherein the gate of the fourth transistor receives the third reference voltage, and the first source/drain of the fourth transistor is coupled to the cross-coupled transistor pair;
 a fifth transistor, comprising a gate, a first source/drain, and a second source/drain, wherein the gate of the fifth transistor receives the mode selection signal, and the first source/drain of the fifth transistor is coupled to the second source/drain of the fourth transistor; and
 a sixth transistor, comprising a gate, a first source/drain, and a second source/drain, wherein the gate of the sixth transistor receives the second input voltage, the first source/drain of the sixth transistor is coupled to the second source/drain of the fifth transistor, and the second source/drain of the sixth transistor is coupled to the ground voltage.

8. The voltage level shifting apparatus as claimed in claim 7, wherein the fourth transistor is a laterally diffused metal oxide semiconductor (LDMOS) transistor.

9. The voltage level shifting apparatus as claimed in claim 1, wherein the cross-coupled transistor pair comprises:
 a first cross-coupled transistor, comprising a gate, a first source/drain, and a second source/drain, wherein the gate of the first cross-coupled transistor receives the operational voltage; and
 a second cross-coupled transistor, comprising a gate, a first source/drain, and a second source/drain, wherein the first source/drain of the second cross-coupled transistor receives the operational voltage, the gate of the second cross-coupled transistor is coupled to the second source/drain of the first cross-coupled transistor, and the second source/drain of the second cross-coupled transistor is coupled to the gate of the first cross-coupled transistor.

10. The voltage level shifting apparatus as claimed in claim 9, wherein the transistor pairs comprise:
 a first transistor pair, coupled to the second source/drain of the first cross-coupled transistor and the second source/drain of the second cross-coupled transistor, having:
  a first transistor, comprising a gate, a first source/drain, and a second source/drain, wherein the first source/drain of the first transistor is coupled to the second source/drain of the first cross-coupled transistor, and the gate of the first transistor receives a second reference voltage of the reference voltages; and
  a second transistor, comprising a gate, a first source/drain, and a second source/drain, wherein the first source/drain of the second transistor is coupled to the second source/drain of the second cross-coupled transistor, and the gate of the second transistor is coupled to the gate of the first transistor; and
 a second transistor pair, coupled to the second source/drain of the first transistor and the second source/drain of the second transistor, having:
  a third transistor, comprising a gate, a first source/drain, and a second source/drain, wherein the first source/drain of the third transistor is coupled to the second source/drain of the first transistor, and the gate of the third transistor receives a first reference voltage of the reference voltages; and
  a fourth transistor, comprising a gate, a first source/drain, and a second source/drain, wherein the first source/drain of the fourth transistor is coupled to the second source/drain of the second transistor, and the gate of the fourth transistor is coupled to the gate of the third transistor.

11. The voltage level shifting apparatus as claimed in claim 10, wherein the first reference voltage is equal to a maximum voltage allowed to be applied to the transistors of the voltage level shifting apparatus, and the second reference voltage is set to be equal to (HV−Vdd−VTP), where HV is a predetermined maximum level of the first output voltage and the second output voltage, Vdd is a logic operational voltage of the voltage level shifting apparatus, and VTP is a threshold voltage of the transistors.

12. The voltage level shifting apparatus as claimed in claim 10, wherein the first diode string comprises:
 a first diode, an anode of the first diode being coupled to the second source/drain of the third transistor; and
 a second diode, an anode of the second diode being coupled to a cathode of the first diode;
 the second diode string comprises:
 a third diode, an anode of the third diode being coupled to the second source/drain of the fourth transistor; and
 a fourth diode, an anode of the fourth diode being coupled to a cathode of the third diode.

13. The voltage level shifting apparatus as claimed in claim 12, wherein the transistor pairs further comprise:
 a third transistor pair, coupled to the cathodes of the second diode and the fourth diode, having:
  a fifth transistor, comprising a gate, a first source/drain, and a second source/drain, wherein the first source/drain of the fifth transistor is coupled to the cathode of the second diode, and the gate of the fifth transistor receives a third reference voltage of the reference voltages, and the second source/drain is coupled to the input transistor pair; and a sixth transistor, comprising a gate, a first source/drain, and a second source/drain, wherein the first source/drain of the sixth transistor is coupled to the cathode of the fourth diode, the gate of the sixth transistor is coupled to the gate of the third transistor, the second source/drain of the sixth transistor is coupled to the input transistor pair, and bases of the fifth transistor and the sixth transistor are coupled to the ground voltage.

14. The voltage level shifting apparatus as claimed in claim 13, wherein the third reference voltage is equal to a logic operational voltage of the voltage level shifting apparatus.

15. The voltage level shifting apparatus as claimed in claim 13, wherein the fifth transistor and the sixth transistor are laterally diffused metal oxide semiconductor (LDMOS) transistors.

16. The voltage level shifting apparatus as claimed in claim 13, wherein the input transistor pair comprises:

a seventh transistor, comprising a gate, a first source/drain, and a second source/drain, wherein the first source/drain of the seventh transistor is coupled to the second source/drain of the fifth transistor, the gate of the seventh transistor receives the first input voltage, and the second source/drain of the seventh transistor is coupled to the ground voltage; and a eighth transistor, comprising a gate, a first source/drain, and a second source/drain, wherein the first source/drain of the eighth transistor is coupled to the second source/drain of the sixth transistor, the gate of the eighth transistor receives the second input voltage, and the second source/drain of the eighth transistor is coupled to the ground voltage.

* * * * *